(12) United States Patent
Cybulsky et al.

(10) Patent No.: US 10,260,139 B2
(45) Date of Patent: Apr. 16, 2019

(54) DIFFUSION BARRIER LAYERS FOR CERAMIC MATRIX COMPOSITES

(71) Applicant: Rolls-Royce Corporation, Indianapolis, IN (US)

(72) Inventors: Michael Cybulsky, Indianapolis, IN (US); Sean E. Landwehr, Avon, IN (US); Stephanie Gong, Indianapolis, IN (US); Kenneth Green, Indianapolis, IN (US); Ann Bolcavage, Indianapolis, IN (US)

(73) Assignee: Rolls-Royce Corporation, Indianapolis, IN (US)

( * ) Notice: Subject to any disclaimer, the term of this patent is extended or adjusted under 35 U.S.C. 154(b) by 380 days.

(21) Appl. No.: 15/074,522

(22) Filed: Mar. 18, 2016

(65) Prior Publication Data

US 2016/0273088 A1    Sep. 22, 2016

Related U.S. Application Data

(60) Provisional application No. 62/135,465, filed on Mar. 19, 2015.

(51) Int. Cl.
| | |
|---|---|
| *C04B 41/00* | (2006.01) |
| *C04B 41/52* | (2006.01) |
| *C04B 41/90* | (2006.01) |
| *C23C 16/06* | (2006.01) |
| *C23C 16/44* | (2006.01) |
| *C23C 28/00* | (2006.01) |

(Continued)

(52) U.S. Cl.
CPC ............. *C23C 4/12* (2013.01); *C04B 41/009* (2013.01); *C04B 41/52* (2013.01); *C04B 41/90* (2013.01); *C23C 4/06* (2013.01); *C23C 16/06* (2013.01); *C23C 16/44* (2013.01); *C23C 28/322* (2013.01); *C23C 28/34* (2013.01); *C23C 28/341* (2013.01);

(Continued)

(58) Field of Classification Search
CPC .. C04B 41/52; C04B 41/5059; C04B 41/5071
See application file for complete search history.

(56) References Cited

U.S. PATENT DOCUMENTS

| | | | |
|---|---|---|---|
| 5,000,896 A | 3/1991 | Petrovic et al. | |
| 5,254,397 A * | 10/1993 | Kawai .................... | C04B 41/52 428/293.4 |

(Continued)

FOREIGN PATENT DOCUMENTS

WO    2008030674 A1    3/2008

OTHER PUBLICATIONS

Extended Search Report from counterpart European Application No. 16160632.2, dated Jul. 22, 2016, 8 pp.

(Continued)

*Primary Examiner* — Melissa A Rioja
(74) *Attorney, Agent, or Firm* — Shumaker & Sieffert, P.A.

(57) ABSTRACT

An article may include a substrate including a ceramic or a CMC; a bond layer on the substrate; and a diffusion barrier layer between the substrate and the bond layer. The diffusion barrier layer may include at least one of molybdenum metal, tantalum metal, tungsten metal, or niobium metal. In some examples, the article may include a stabilizing layer that includes at least one of a silicide of molybdenum ($MoSi_2$), tantalum ($TaSi_2$), tungsten ($WSi_2$), or niobium ($NbSi_2$), between the diffusion barrier layer and the bond layer.

20 Claims, 4 Drawing Sheets

(51) Int. Cl.
  *C23C 4/06* (2016.01)
  *C23C 4/12* (2016.01)
  *F01D 5/28* (2006.01)
  *C04B 35/565* (2006.01)
  *C04B 35/80* (2006.01)
  *C04B 41/50* (2006.01)
  *C04B 41/51* (2006.01)

(52) U.S. Cl.
  CPC .......... *C23C 28/3455* (2013.01); *F01D 5/282* (2013.01); *F01D 5/284* (2013.01); *F01D 5/288* (2013.01); *C04B 41/5059* (2013.01); *C04B 41/5071* (2013.01); *F05D 2230/312* (2013.01); *F05D 2230/314* (2013.01); *F05D 2300/22* (2013.01)

(56) References Cited

U.S. PATENT DOCUMENTS

| | | | |
|---|---|---|---|
| 6,200,691 B1 | 3/2001 | Moore et al. | |
| 6,261,692 B1* | 7/2001 | Park | C04B 35/83 428/297.1 |
| 7,115,319 B2 | 10/2006 | Raybould et al. | |
| 7,189,459 B2 | 3/2007 | Jackson et al. | |
| 7,300,702 B2 | 11/2007 | Li et al. | |
| 7,442,444 B2 | 10/2008 | Hazel et al. | |
| 7,638,178 B2 | 12/2009 | Raybould et al. | |
| 2005/0042461 A1* | 2/2005 | Li | C04B 41/009 428/446 |
| 2007/0065672 A1* | 3/2007 | Bhatia | C04B 41/009 428/446 |
| 2012/0132921 A1* | 5/2012 | Chen | H01L 1/02365 257/76 |
| 2013/0157064 A1 | 6/2013 | Perepezko et al. | |
| 2013/0344319 A1 | 12/2013 | Zhu et al. | |
| 2016/0312628 A1* | 10/2016 | Kirby | C23C 16/56 |

OTHER PUBLICATIONS

Response to Search Report dated Jul. 22, 2016, from counterpart European Application No. 16160632.2, filed Feb. 28, 2017, 5 pp.

* cited by examiner

DIFFUSION BARRIER LAYERS FOR CERAMIC MATRIX COMPOSITES

This application claims the benefit of U.S. Provisional Application No. 62/135,465 filed Mar. 19, 2015, which is incorporated herein by reference in its entirety.

TECHNICAL FIELD

The present disclosure generally relates to techniques for improving the useful life of a ceramic matrix composite substrate by including barrier layer.

BACKGROUND

Ceramic or ceramic matrix composite (CMC) materials may be useful in a variety of contexts where mechanical and thermal properties are important. For example, components of high temperature mechanical systems, such as gas turbine engines, may be made from ceramic or CMCs. Ceramic or CMC materials may be useful in high temperature environments, but some ceramics or CMCs may react with some elements and compounds present in the operating environment of high temperature mechanical systems, such as water vapor. Reaction with water vapor may result in the recession of the ceramic or CMC substrate. These reactions may damage the ceramic or CMC and reduce mechanical properties of the ceramic or CMC, which may reduce the useful life of the component. In some examples, a ceramic or CMC substrate may be coated with an environmental barrier coating, which may reduce exposure of the substrate to elements and compounds present in the operating environment of high temperature mechanical systems.

SUMMARY

The present disclosure describes an article including a ceramic or ceramic matrix composite (CMC) substrate and a diffusion barrier layer on the ceramic or CMC substrate. In some examples, the disclosure describes an article that includes a substrate including a ceramic or a CMC; a diffusion barrier layer on the substrate; and a bond layer on the diffusion barrier layer. The diffusion barrier layer may include at least one of molybdenum metal, tantalum metal, tungsten metal, or niobium metal, and the bond layer may include silicon metal.

In some examples, the disclosure describes a method including forming a diffusion barrier layer comprising at least one of molybdenum metal, tantalum metal, tungsten metal, or niobium metal on a ceramic or ceramic matrix composite (CMC) substrate; and forming a bond layer on the diffusion barrier layer, where the bond layer includes silicon metal.

The details of one or more examples are set forth in the accompanying drawings and the accompanying description below. Other features, objects, and advantages will be apparent from the description and drawings, and from the claims.

DETAILED DESCRIPTION

Figure 1:
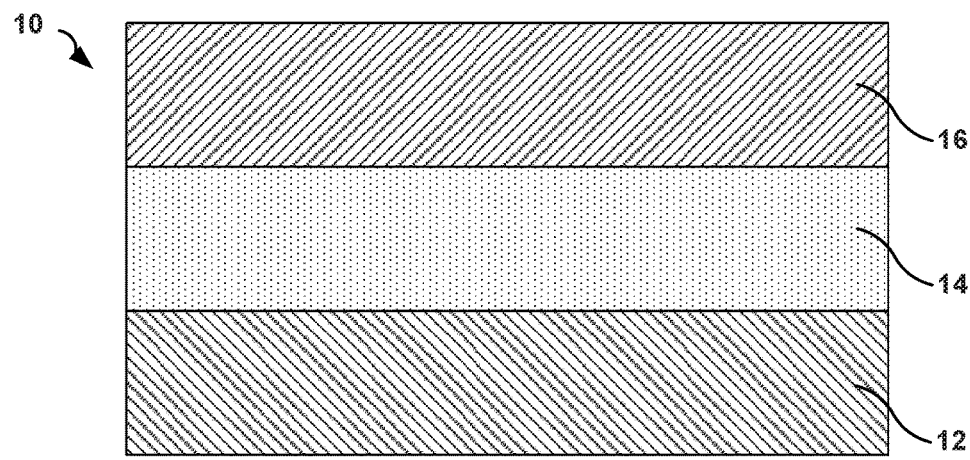
FIG. 1 is a conceptual diagram illustrating an example article including a ceramic or ceramic matric composite (CMC) substrate, a diffusion barrier layer, and a bond layer.

The disclosure describes coating systems for a ceramic or ceramic matrix composite (CMC). The coating systems may include a diffusion barrier layer that includes a transition metal, such as molybdenum metal, tantalum metal, tungsten metal, or niobium metal. The diffusion barrier layer may reduce or substantially prevent diffusion of elements from the ceramic or CMC to a layer on the diffusion barrier layer, such as a bond layer. As described above, ceramic or CMC components are useful in a variety of high temperature applications, including, for example, gas turbine engines. Ceramic or CMC components have excellent high temperature mechanical, physical, and chemical properties which allow gas turbine engines to operate at high temperatures. However, one drawback with ceramic or CMC components is their lack of environmental durability in combustion environments, particularly in the presence of water vapor. At high temperatures, water vapor can react with CMC components, e.g., silicon in silicon carbide/silicon carbide (SiC/SiC) CMCs. These reactions cause the components in the outer edge of the CMC to become volatile, resulting in the slow regression of the CMC cross section, thereby diminishing the useful life of the ceramic or CMC.

In some examples, protective coatings such as environmental barrier coatings (EBCs) may be applied to ceramic or CMC components to hinder and slow the ingress of water vapor, thereby increasing the CMC's useful life. The use of a bond layer, such as, for example a bond layer including silicon metal, may provide better adhesion between the CMC and EBC.

Even with the presence of such protective coatings, however, the diffusion of certain molecules, such as oxygen, into the article can still occur. For example, oxygen that diffuses through the EBC can react with the bond layer forming an oxide layer, e.g., silicon dioxide ($SiO_2$), at the interface between the bond layer and the EBC. The growth of the oxide layer may cause deleterious effects including, for example, a thermal expansion mismatch between the bond layer and the EBC, which may result in mechanical stress at the interface and, ultimately, the spallation of the EBC, thereby exposing the ceramic or CMC to water vapor. The growth rate of the oxide layer may be increased due to the diffusion of certain elements in the ceramic or CMC such as, for example, boron and calcium, to the bond layer. These elements may catalyze the growth of the oxide layer. Additionally, these deleterious elements can affect the physical structure of the oxide layer, for example transforming $SiO_2$ from an amorphous state to a crystalline structure. Such transformations in the physical structure of the oxide layer may cause embrittlement, thereby increasing the chance of cracking or spallation and decreasing the overall useful life of the ceramic or CMC.

A diffusion barrier layer as described herein may reduce or substantially prevent the diffusion of deleterious elements, such as boron or calcium, from the ceramic or CMC substrate to the bond layer, thereby slowing the growth rate of the oxide layer and increasing the useful life of the component. In some examples, the diffusion barrier layer may include at least one of molybdenum metal, tantalum metal, tungsten metal, or niobium metal. For example, a diffusion barrier layer that includes molybdenum metal can react with the deleterious elements such as boron or calcium to form molybdenum boride or molybdenum calcide, which may diffuse more slowly to the bond layer than free boron or calcium, and may not contribute to the formation of the oxide layer or changing of properties of the bond layer. Furthermore, molybdenum metal has excellent mechanical strength at high temperatures and a coefficient of thermal expansion (CTE) (typically about 5.2 ppm/° C. to about 6 ppm/° C.) that is compatible with a the CTE of a SiC/SiC CMC substrate (typically about 5 ppm/° C.). As used herein, a compatible CTE means that the CTEs of the adjacent layers, depending on the thicknesses of the layers, may differ from each other by less than about 45%. In some examples, the CTEs of adjacent layers may differ from each other by less than about 40%. The CTE for a layer may be determined using any suitable technique including, for example, using a push-rod dilatometer testing procedure as set forth and described by ASTM Test Method E228.

In some examples, a stabilizing layer that includes at least one of a silicide of molybdenum ($MoSi_2$), tantalum ($TaSi_2$), tungsten ($WSi_2$), or niobium ($NbSi_2$), may be between the diffusion barrier layer and the bond layer. The presence of the stabilizing layer reduces the reaction that may occur between the diffusion barrier layer and the bond layer, for example the reaction of molybdenum metal with silicon metal in a bond layer.

FIG. 1 is a conceptual illustration of an example article 10 including a substrate 12, a diffusion barrier layer 14 on substrate 12, and a bond layer 16 on diffusion barrier layer 14.

Article 10 may be a component of a high temperature mechanical system. For example, article 10 may be a seal segment, a blade track, an airfoil, a blade, a vane, a combustion chamber liner, or the like, of a gas turbine engine.

Article 10 includes substrate 12. Substrate 12 may include a ceramic or a CMC. Example ceramic materials may include, for example, silicon carbide (SiC), silicon nitride ($Si_3N_4$), alumina ($Al_2O_3$), aluminosilicate, silica ($SiO_2$), transition metal carbides and silicides (e.g. WC, $Mo_2C$, TiC, $MoSi_2$, $NbSi_2$, $TiSi_2$), or the like. In some examples, substrate 12 additionally may include silicon metal, carbon, or the like. In some examples, substrate 12 may include mixtures of two or more of SiC, $Si_3N_4$, $Al_2O_3$, aluminosilicate, silica, silicon metal, carbon, or the like.

In examples in which substrate 12 includes a CMC, substrate 12 includes a matrix material and a reinforcement material. The matrix material includes a ceramic material, such as, for example, silicon metal, SiC, or other ceramics described herein. The CMC further includes a continuous or discontinuous reinforcement material. For example, the reinforcement material may include discontinuous whiskers, platelets, fibers, or particulates. As other examples, the reinforcement material may include a continuous monofilament or multifilament weave. In some examples, the reinforcement material may include SiC, C, other ceramic materials described herein, or the like. In some examples, substrate 12 includes a SiC—SiC ceramic matrix composite.

Substrate 12 may be manufactured using one or more techniques including, for example, chemical vapor deposition (CVD), chemical vapor infiltration (CVI), polymer impregnation and pyrolysis (PIP), liquid polymer infiltration (LPI), slurry infiltration, liquid silicon infiltration (LSI), melt infiltration (MI), CVI in combination with MI, or other techniques.

Article 10 also includes diffusion barrier layer 14. Diffusion barrier layer 14 may include elements or compounds and a physical configuration that reduces or substantially prevents diffusion of one or more elements or compounds from substrate 12 to bond layer 16. For example, diffusion barrier layer 14 may include at least one of molybdenum metal, tantalum metal, tungsten metal, or niobium metal, (e.g., molybdenum, tantalum, tungsten, or niobium in free form, rather than in the form of a compound with another element). Molybdenum metal, tantalum metal, tungsten metal, or niobium metal may reduce diffusion of elements or compounds from substrate 12 to bond layer 16 by forming a physical barrier through which elements or compounds must move to reach bond layer 16 from substrate 12. Further, molybdenum metal, tantalum metal, tungsten metal, or niobium metal may react with some elements that may diffuse from substrate 12 into diffusion barrier layer 14, such as boron or calcium to form compounds, such as molybdenum boride or calcium molybdate. The resulting compounds may diffuse more slowly through diffusion barrier layer 14 than the free elements, and also may be less reactive with constituents of bond layer 16 than the free elements. In some examples, the diffusion barrier layer 14 may consist essentially of at least one of molybdenum metal, tantalum metal, tungsten metal, or niobium metal. In some examples, the diffusion barrier layer 14 may consist of at least one of molybdenum metal, tantalum metal, tungsten metal, or niobium metal.

Diffusion barrier layer 14 may have a coefficient of thermal expansion (CTE) that is compatible with the CTE of substrate 12. For example, a SiC—SiC CMC may have a CTE of about 5 parts per million per degree Celsius (ppm/° C.). Molybdenum metal may have a CTE of about 5.2 to about 6 ppm/° C., tungsten metal may have a CTE of about 4.1 to about 4.8 ppm/° C., tantalum metal may have a CTE of about 6.5 to about 7 ppm/° C., and niobium may have a CTE of about 7.2 to about 9 ppm/° C. at temperatures from about 200 to 1200 Celsius. Depending on the composition of diffusion barrier 14, in some examples, diffusion barrier layer 14 may have a CTE between about 4 ppm/° C. and about 9 ppm/° C., in some examples between about 4 ppm/° C. and about 6 ppm/° C., and in some examples between about 5.2 ppm/° C. and about 6 ppm/° C.

In some examples, diffusion barrier layer 14 may include a mixture of elements, such as two or more of molybdenum metal, tantalum metal, tungsten metal, or niobium metal; a mixture of at least one of molybdenum metal, tantalum metal, tungsten metal, or niobium metal and one or more additional, other transition metals; or the like. For example, diffusion barrier layer 14 may include a combination of molybdenum metal and tungsten metal to modify the CTE of diffusion barrier layer 14. In some examples, diffusion barrier layer 14 may be directly contacting substrate 12 as shown in FIG. 1. In other examples, one or more transition layers may exist between substrate 12 and diffusion barrier layer 14, thereby separating substrate 12 and diffusion barrier layer 14 from being in direct contact. The use of the description of one layer being "on" another, as used herein, is meant to encompass both configurations.

In some examples, diffusion barrier layer 14 may include silicon carbide (SiC) in addition to the at least one of molybdenum metal, tantalum metal, tungsten metal, or niobium metal. The presence of SiC within diffusion barrier layer 14 may improve the adherence of diffusion barrier layer 14 to substrate 12 or another adjacent layer (e.g., bond layer 16). Additionally, SiC may modify the CTE of diffusion barrier layer 14 to allow for better CTE compatibility between the diffusion barrier layer 14 and substrate 12 or between diffusion barrier layer 14 and another adjacent layer (e.g., bond layer 16). The SiC may be in the form of particles, whiskers, or the like.

Diffusion barrier layer 14 may be formed on substrate 12 using a variety of techniques such as, for example, thermal spraying (e.g., plasma spraying), CVD, physical vapor deposition (PVD), slurry deposition, or the like. In some examples, the thickness of diffusion barrier layer 14 may be selected based at least in part on the application technique. For example, CVD may deposit diffusion barrier layer 14 as a relatively dense layer, and may be used to form a relatively thin diffusion barrier layer 14, e.g., on the order of 10 microns. As another example, plasma spraying may deposit diffusion barrier layer 14 as a less dense layer, and may be used form a relatively thicker diffusion barrier 14, e.g. on the order of about 75 microns or more.

Article 10 also includes bond layer 16 on diffusion barrier layer 14. In some examples, bond layer 16 may be in direct contact with diffusion barrier 14, as shown in FIG. 1. In other examples, bond layer 16 may be separated from diffusion barrier layer 14 by one or more additional layers, such as, for example, the arrangement shown in FIG. 2.

In some examples, bond layer 16 may include silicon metal, alone, or mixed with at least one other constituent. For example, bond layer 16 may include silicon metal and at least one of a transition metal carbide, a transition metal boride, a transition metal nitride, mullite (aluminum silicate, $Al_6Si_2O_{13}$), silica, a silicide, an oxide (e.g., a rare earth oxide, an alkali oxide, or the like), a silicate (e.g., a rare earth silicate or the like), or the like. In some examples, the additional constituent(s) may be substantially homogeneously mixed with silicon metal. In other examples, the additional constituent(s) may form a second phase distinct from the silicon metal phase.

By including diffusion barrier layer 14 between substrate 12 and bond layer 16, diffusion of elements or compounds from substrate 12 to bond layer 16, and vice versa, may be reduced. For example, substrate 12 may include boron, calcium, or other elements or compounds that may detrimentally affect bond layer 16. If present in bond layer 16, boron may accelerate oxidation of bond layer 16, may change physical or chemical properties of bond layer 16, or may otherwise detrimentally affect bond layer 16. Diffusion barrier layer 14 may reduce or substantially eliminate diffusion of boron, calcium, or other elements or compounds from substrate 12 to bond layer 16, reducing the effects of these elements or compounds on bond layer 16. In this way, diffusion barrier layer 14 may improve a useful life of bond layer 16 and article 10 compared to an article that does not include diffusion barrier layer 14.

Figure 2:
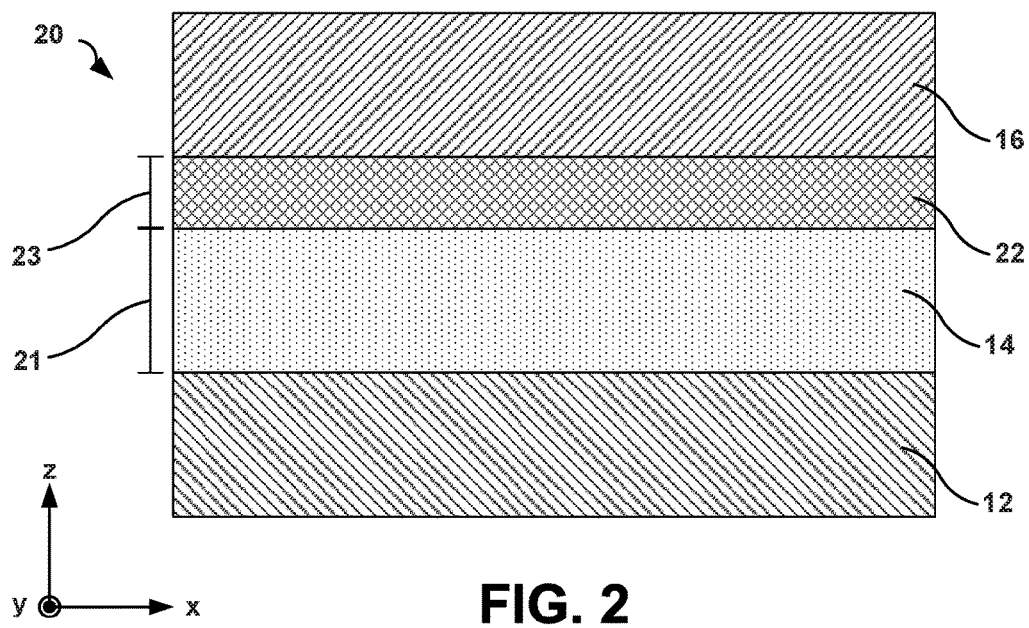
FIG. 2 is a conceptual diagram illustrating an example article that includes a stabilizing layer between a diffusion barrier layer and a bond layer.

In some examples, an article may include an additional layer between diffusion barrier layer 14 and bond layer 16. FIG. 2 is a conceptual diagram illustrating an example article 20 that includes a substrate 12, a diffusion barrier layer 14, a stabilizing layer 22, and a bond layer 16. As shown in FIG. 2, stabilizing layer 22 is between bond layer 16 and diffusion barrier layer 14. Stabilizing layer 22 may aid in the durability of article 20 by reducing interaction between constituents of diffusion barrier layer 14 and constituents of bond layer 16. In some examples, stabilizing layer 22 is in direct contact with diffusion barrier layer 14 and bond layer 16, such as shown in FIG. 2. In other examples, diffusion barrier layer 14, bond layer 16, or both may be separated from stabilizing layer 22 by the inclusion of one or more transition layers.

Stabilizing layer 22 may include a silicide of at least one of the constituents of diffusion barrier layer 14. For example, stabilizing layer 22 may include a silicide of at least one of molybdenum metal, tantalum metal, tungsten metal, or niobium metal. The choice of silicide or combination of silicides may depend at least in part on the composition of diffusion barrier layer 14 to provide chemical compatibility with diffusion barrier layer 14. For example a diffusion barrier layer 14 that includes molybdenum metal may be paired with a stabilizing layer 22 that includes $MoSi_2$.

In some examples, the CTE of stabilizing layer 22 may be between the CTE of diffusion barrier layer 14 and the CTE of bond layer 16 to provide the CTE compatibility among the layers.

In some examples, stabilizing layer 22 may also include SiC or other additives. The SiC or other additives may improve mechanical properties of stabilizing layer 22 or CTE compatibility between stabilizing layer 22 and adjacent layers (e.g., bond layer 16). In some examples, SiC may be present in about equal parts with the at least one of $MoSi_2$, $TaSi_2$, $WSi_2$, or $NbSi_2$ (e.g., about 50% by volume SiC and 50% by volume $MoSi_2$). Additionally, the SiC may be in the form of particles, whiskers, or the like.

Diffusion barrier layer 14 defines a thickness 21 and stabilizing layer 22 defines thickness 23, each measured in the z-axis direction, moving perpendicularly outward from the substrate 12. Thickness 23 of stabilizing layer 22 may be relatively thin to reduce CTE mismatch between stabilizing layer 22 and adjacent layers (e.g., diffusion barrier layer 14, bond layer 16, or both). In some examples, thickness 23 of stabilizing layer 22 may be between about 1 micrometers and about 100 micrometers. As described above, thickness 21 of diffusion barrier layer 14 may be, for example, about 10 micrometers, greater than 10 micrometers, about 75 micrometers, greater than 75 micrometers, or the like. In some examples, thickness 23 of stabilizing layer 22 is less than thickness 21 of diffusion barrier layer 14.

In some examples, stabilizing layer 22 is formed intentionally as part of a formation process of article 20. For example, stabilizing layer 22 may be formed on diffusion barrier layer 14 using a variety of techniques including, for example, thermal spraying (e.g., plasma spraying), CVD, PVD, slurry deposition, the like. Bond layer 16 then may be formed on stabilizing layer 22.

In other examples, stabilizing layer 22 may be formed during operation of article 20. At initial manufacture, bond layer 16 may be formed directly on diffusion barrier layer 14. In some examples, the at least one of molybdenum metal, tantalum metal, tungsten metal, or niobium metal in diffusion barrier layer 14 reacts with silicon metal in bond layer 16 to form the least one of $MoSi_2$, $TaSi_2$, $WSi_2$, or $NbSi_2$. The resultant reaction forms stabilizing layer 22 about the interface of diffusion barrier layer 14 and bond layer 16. In some examples, if stabilizing layer 22 is allowed to form during operation of article 20, diffusion barrier 14 may be sufficiently thick to allow for some of the at least one of molybdenum metal, tantalum metal, tungsten metal, or niobium metal to react with silicon metal in bond layer 16 to form stabilizing layer 22 without significantly depleting the at least one of molybdenum metal, tantalum metal, tungsten metal, or niobium metal in diffusion barrier layer 14. In some examples, the silicide deposited intentionally or formed through reaction of the at least one of molybdenum metal, tantalum metal, tungsten metal, or niobium metal and silicon metal may not form a distinct layer between diffusion barrier layer 14 and bond layer 16, but may be present in varying concentrations within diffusion barrier layer 14, bond layer 16, or both, with a higher concentration at an interface between diffusion barrier layer 14 and bond layer 16 and a decreasing concentration at locations further from the interface.

In some examples, by including stabilizing layer 22 between diffusion barrier layer 14 and bond layer 16, reaction of constituents of diffusion barrier layer 14 and bond layer 16 may be reduced, which may allow constituents of diffusion barrier layer 14 to react with elements or compounds diffusing from substrate 12 (e.g., boron), and may increase the effectiveness of diffusion barrier layer 14 in preventing diffusion of deleterious elements, such as boron, from substrate 12 to bond layer 16.

Figure 3:
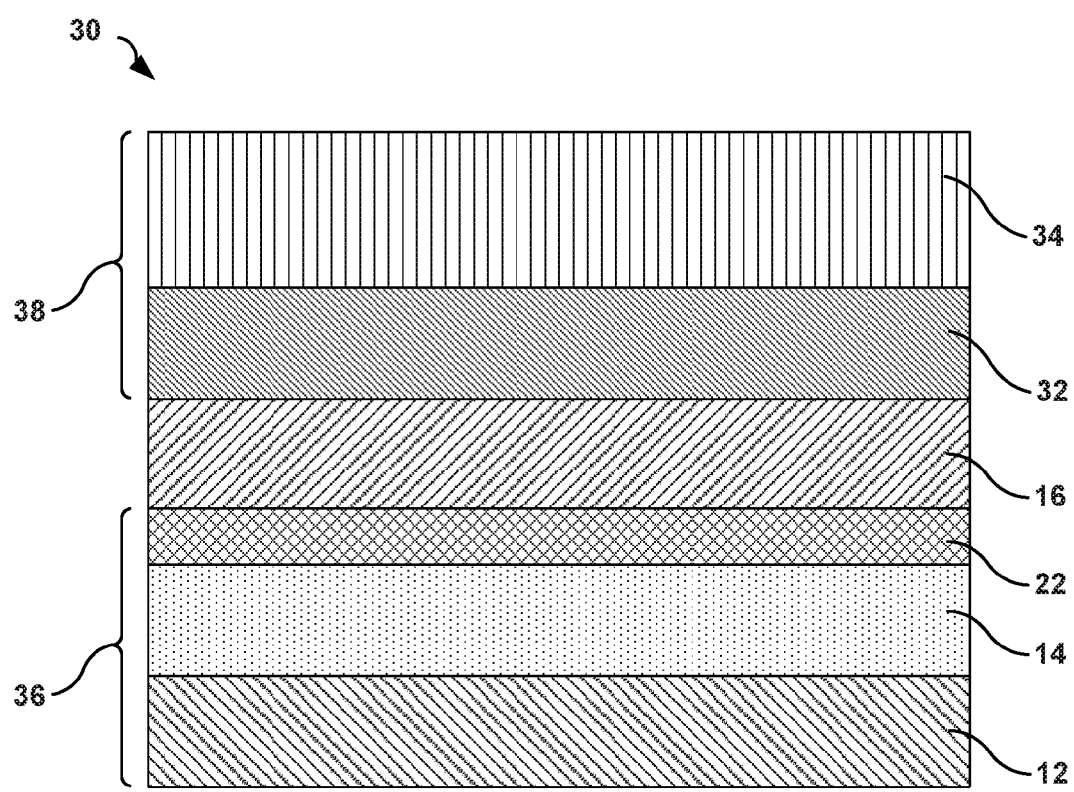
FIG. 3 is a conceptual diagram illustrating an example article that includes additional, optional coating layers on a bond layer and a diffusion barrier layer.

In some examples, instead of including only bond layer 16 on diffusion barrier layer 14, an article may include one or more additional layers on bond layer 16. FIG. 3 is a conceptual diagram illustrating another example article 30 that includes one or more outer coating layers 38 formed on bond layer 16. In such configurations, bond layer 16 may act to improve the adhesion, CTE compatibility, or both between outer coating layers 38 and underlying article components 36. Outer coating layers 38 may include, for example, an environmental barrier coating (EBC) 32, an abradable layer 34, or the like. In some examples, the outer coating layers 38 may include a single layer that performs multiple functions. For example, while depicted in FIG. 3 as two layers, EBC 32 and abradable layer 34 may be a formed as a single layer serving both functions. Thus, while depicted as including both EBC 32 and abradable layer 34, in other examples, article 30 may include only EBC 32, only abradable layer 34, both EBC 32 and abradable layer 34, or the like.

EBC 32 may include constituents and a physical construction selected to reduce contact of underlying layers with chemical species present in the environment in which article 30 is used, such as water vapor, calcia-magnesia-alumina-silicate (CMAS; a contaminant that may be present in intake gases of gas turbine engines), or the like. EBC 32 may include at least one of a rare earth oxide, a rare earth silicate, an aluminosilicate, or an alkaline earth aluminosilicate. For example, EBC 32 may include at least one rare earth monosilicate ($RE_2SiO_5$, where RE is a rare earth element), at least one rare earth disilicate ($RE_2Si_2O_7$, where RE is a rare earth element), or combinations thereof. In some examples, EBC 32 may include an additive in addition to the primary constituents of EBC 32. For example, EBC 32 may include at least one of $TiO_2$, $Ta_2O_5$, $HfSiO_4$, alumina ($Al_2O_3$), an alkali metal oxide, or an alkali earth metal oxide. The additive may be added to EBC 32 to modify one or more desired properties of EBC 32. For example, the additive components may increase or decrease the reaction rate of EBC 32 with calcia-magnesia-alumina-silicate (CMAS; a contaminant that may be present in intake gases of gas turbine engines), may modify the viscosity of the reaction product from the reaction of CMAS and constituent(s) of EBC 32, may increase adhesion of EBC 32 to bond layer 16, may increase or decrease the chemical stability of EBC 32, or the like. In some examples, EBC 32 may be a substantially non-porous layer (e.g., may include a porosity of less than about 5 volume percent).

In some examples, outer coating layers 38 includes abradable layer 34, alone or in addition to EBC 32. Abradable layer 34 may include constituents and a physical construction so that abradable layer 34 is disposed to abrade or break in a controlled manner when exposed to mechanical forces of sufficient force. In some examples, abradable layer 34 may include at least one of a rare earth oxide, a rare earth silicate, an aluminosilicate, or an alkaline earth aluminosilicate. Abradable layer may be porous 34. Porosity of abradable layer 34 may reduce thermal conductivity of abradable layer 34 and/or may affect the abradability of abradable layer 34. In some examples, abradable layer 34 includes porosity between about 5 vol. % and about 50 vol. %. In other examples, abradable layer 34 includes porosity between about 15 vol. % and about 35 vol. %, or about 20 vol. %.

Porosity of abradable layer 34 is defined herein as a volume of pores or cracks in abradable layer 34 divided by a total volume of abradable layer 34 (including both the volume of material in abradable layer 34 and the volume of pores/cracks in abradable layer 34). The porosity of abradable layer 34 may be controlled by the use of coating material additives and/or processing techniques to create the desired porosity. In some examples, substantially closed pores may be desired. For example, a coating material additive that melts or burns at the use temperatures of the component (e.g., a blade track) may be incorporated into the coating material that forms the abradable layer 34. The coating material additive may include, for example, graphite, hexagonal boron nitride, or a polymer such as a polyester, and may be incorporated into the coating material prior to deposition of the coating material over substrate 12 to form abradable layer 34. The coating material additive then may be melted or burned off in a post-formation heat treatment, or during operation of the gas turbine engine, to form pores in abradable layer 34. The post-deposition heat-treatment may be performed at up to about 1500° C.

Bond layer 16 and outer coating layers 38 may be applied using a variety of techniques including, for example, thermal spraying (e.g., plasma spraying), PVD, electron beam physical vapor deposition (EB-PVD), directed vapor deposition (DVD), CVD, cathodic arc deposition slurry process deposition, sol-gel process deposition, or electrophoretic deposition.

Although described herein primarily as a layer between substrate 12 and bond layer 16, in other examples, diffusion barrier layer 14 may be the only layer on a substrate 12. For example, in applications in which a ceramic or CMC component is exposed to relatively low air velocities, relatively low moisture content, and/or temperatures below about 800° C., diffusion barrier layer 14 may be used as the only layer on substrate 12. In such implementations, diffusion barrier layer 14 may reduce or substantially prevent boron or other elements from diffusing from substrate 12. Without diffusion barrier layer 14, boron in substrate 12 may be exposed to oxygen or other oxidizing agents, and may form boron oxide (boria), which is relatively volatile, and may result in loss of volume of substrate 12.

Figure 4:
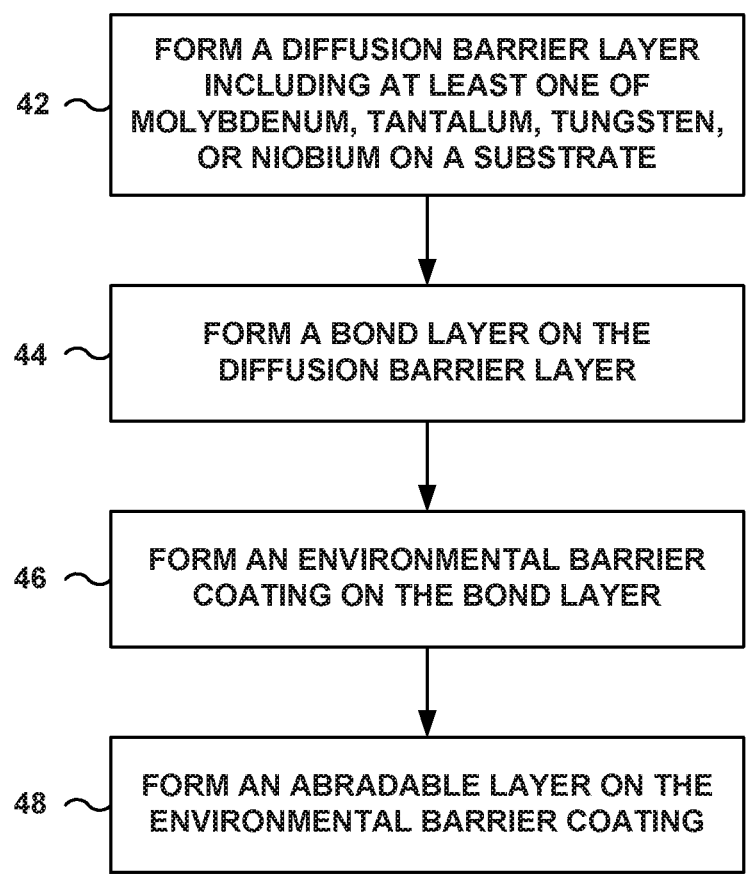
FIG. 4 is a flow diagram illustrating an example technique for forming an article including forming a diffusion barrier layer on a ceramic of a CMC substrate and forming a bond layer on the diffusion barrier layer.
Figure 5:
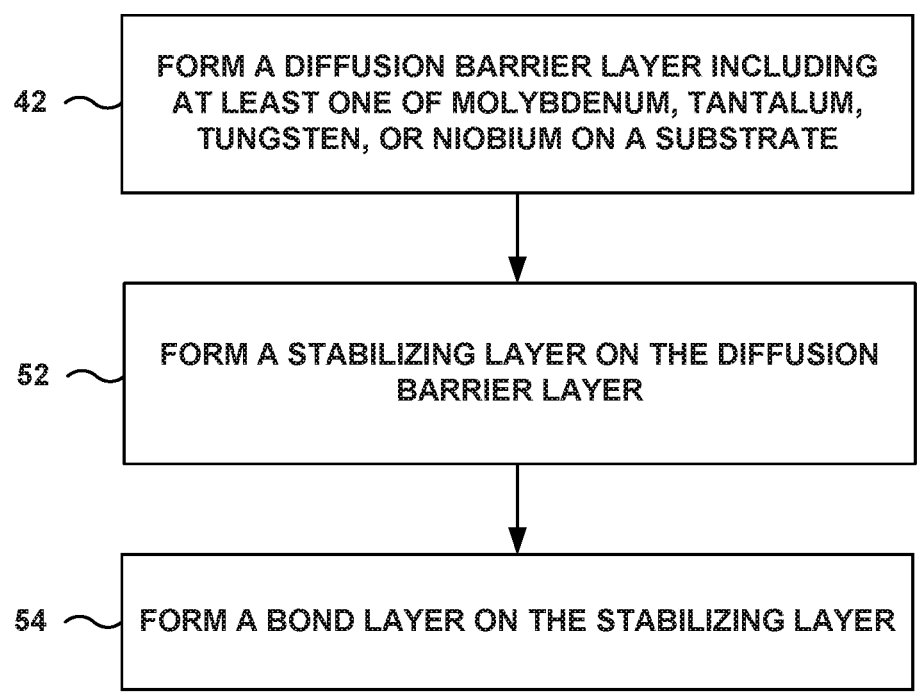
FIG. 5 is a flow diagram illustrating an example technique for forming an article that includes a stabilizing layer between a diffusion barrier layer and a bond layer.

FIGS. 4 and 5 are flow diagrams illustrating example techniques for forming an article including a diffusion barrier layer. FIGS. 4 and 5 are described below in reference to FIGS. 1-3 for illustrative purposes, however, such descriptions are not intended to be limiting and the techniques of FIGS. 4 and 5 may be used to form other articles or the articles of FIGS. 1-3 may be formed using other techniques.

FIG. 4 illustrates an example technique that includes forming diffusion barrier layer 14 on a substrate 12 (42). As described above, diffusion barrier layer 14 may be formed using any one or more of a variety of techniques, including, for example, CVD, PVD, slurry deposition, thermal spraying, or the like. Bond layer 16 then may be formed on diffusion barrier layer 14 (44). As described above, bond layer 16 may be formed using any one or more of a variety of techniques, including, for example, CVD, PVD, slurry deposition, thermal spraying, or the like. In some examples, one or more additional coating layers may optionally be formed on bond layer 16. For example, a technique may include forming an EBC 32 on the bond layer 16 (46), forming abradable layer 34 on EBC 32 or bond layer 16 (48), or both. EBC 32 and abradable layer 34 each may be formed using any one or more of a variety of techniques, including, for example, CVD, PVD, slurry deposition, thermal spraying, or the like.

FIG. 5 illustrates another example technique for making an article that includes a diffusion barrier layer 14. The technique of FIG. 5 includes forming diffusion barrier layer 14 on substrate 12 (42). Additionally, the technique of FIG. 5 includes forming stabilizing layer 22 on diffusion barrier layer 14 (52), followed by forming bond layer 16 on stabilizing layer 22 (54).

Various examples have been described. These and other examples are within the scope of the following claims.

What is claimed is:

1. An article comprising:
    a substrate comprising a ceramic or a ceramic matrix composite;
    a diffusion barrier layer on the substrate, wherein the diffusion barrier layer comprises at least one free-form metal selected from the group consisting of free-form molybdenum, free-form tantalum, free-form tungsten, and free-form niobium; and
    a bond layer on the diffusion barrier layer, wherein the bond layer comprises free-form silicon.

2. The article of claim 1, wherein the diffusion barrier layer comprises free-form molybdenum.

3. The article of claim 1, wherein the diffusion barrier layer further comprises silicon carbide (SiC).

4. The article of claim 1, wherein the diffusion barrier layer further comprises a transition metal other than the least one free-form metal.

5. The article of claim 1, wherein the diffusion barrier layer further comprises at least one of $MoSi_2$, $TaSi_2$, $WSi_2$, or $NbSi_2$.

6. The article of claim 1, wherein the coefficient of thermal expansion (CTE) of the diffusion barrier layer is between about 4 parts per million per degree Celsius (ppm/° C.) and about 6 ppm/° C.

7. The article of claim 1, further comprising a stabilizing layer comprising at least one of $MoSi_2$, $TaSi_2$, $WSi_2$, or $NbSi_2$, wherein the stabilizing layer is between the diffusion barrier layer and the bond layer.

8. The article of claim 7, wherein the stabilizing layer has a coefficient of thermal expansion (CTE) that is between a CTE of the diffusion barrier layer and a CTE of the bond layer.

9. The article of claim 7, wherein the stabilizing layer further comprises silicon carbide (SiC).

10. The article of claim 1, further comprising an environmental barrier coating on the bond layer.

11. The article of claim 10, wherein the environmental barrier coating is abradable and comprises a porous microstructure.

12. The article of claim 10, further comprising a porous abradable layer on the environmental barrier coating.

13. A method comprising:
    forming a diffusion barrier layer on a substrate comprising a ceramic or ceramic matrix composite, wherein the diffusion barrier layer comprises at least one free-form metal selected from the group consisting of free-form molybdenum, free-form tantalum, free-form tungsten, and free-form niobium; and
    forming a bond layer on the diffusion barrier layer, wherein the bond layer comprises free-form silicon.

14. The method of claim 13, wherein the diffusion barrier layer comprises free-form molybdenum.

15. The method of claim 13, further comprising forming a stabilizing layer between the diffusion barrier layer and the bond layer, wherein the stabilizing layer comprises at least one of $MoSi_2$, $TaSi_2$, $WSi_2$, or $NbSi_2$.

16. The method of claim 15, wherein at least one of the diffusion barrier layer or the stabilizing layer further comprises silicon carbide (SiC).

17. The method of claim 13, further comprising forming an environmental barrier coating on the bond layer.

18. The method of claim 17, further comprising forming an abradable layer on the environmental barrier coating.

19. An article comprising:
    a substrate comprising a ceramic or a ceramic matrix composite;
    a diffusion barrier layer on the substrate, wherein the diffusion barrier comprises at least one free-form metal selected from the group consisting of free-form molybdenum, free-form tantalum, free-form tungsten, and free-form niobium;
    a stabilizing layer on the diffusion barrier layer, wherein the stabilizing layer comprises at least one silicide of the at least one free-form metal of the diffusion barrier layer; and
    a bond layer on the stabilizing layer.

20. The article of claim 1, wherein the diffusion barrier layer further comprises a reaction product of the at least one free-form metal and at least one of boron or calcium.

* * * * *